United States Patent
Kub et al.

(10) Patent No.: US 10,002,958 B2
(45) Date of Patent: Jun. 19, 2018

(54) DIAMOND ON III-NITRIDE DEVICE

(71) Applicant: The United States of America, as represented by the Secretary of the Navy, Washington, DC (US)

(72) Inventors: Francis J. Kub, Arnold, MD (US); Travis J. Anderson, Alexandria, VA (US); Virginia D. Wheeler, Alexandria, VA (US); Andrew D. Koehler, Alexandria, VA (US); Karl D. Hobart, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/617,982

(22) Filed: Jun. 8, 2017

(65) Prior Publication Data
US 2017/0358670 A1     Dec. 14, 2017

Related U.S. Application Data

(60) Provisional application No. 62/347,287, filed on Jun. 8, 2016.

(51) Int. Cl.
*H01L 29/778* (2006.01)
*H01L 29/47* (2006.01)
(Continued)

(52) U.S. Cl.
CPC ...... *H01L 29/7787* (2013.01); *H01L 21/0254* (2013.01); *H01L 21/02115* (2013.01); *H01L 21/02378* (2013.01); *H01L 21/283* (2013.01); *H01L 23/3732* (2013.01); *H01L 29/0891* (2013.01); *H01L 29/2003* (2013.01); *H01L 29/205* (2013.01); *H01L 29/402* (2013.01); *H01L 29/42316* (2013.01); *H01L 29/475* (2013.01); *H01L 29/66462* (2013.01); *H01L 21/0217* (2013.01); *H01L 21/02057* (2013.01); *H01L 21/31111* (2013.01)

(58) Field of Classification Search
CPC ......... H01L 29/66431; H01L 29/66462; H01L 29/778; H01L 21/02085; H01L 21/02376; H01L 21/02444; H01L 21/02527; H01L 29/1602; H01L 29/7787; H01L 21/02115
See application file for complete search history.

(56) References Cited

U.S. PATENT DOCUMENTS 7,067,361 B2 * 6/2006 Allen ............... H01L 21/7605
                                                257/E21.055
2009/0146186 A1 * 6/2009 Kub ................... H01L 29/1602
                                                257/194

(Continued)

*Primary Examiner* — Julia Slutsker
(74) *Attorney, Agent, or Firm* — US Naval Research Laboratory; William P. Ladd

(57) ABSTRACT

Systems and method are provided for depositing metal on GaN transistors after gate formation using a metal nitride Schottky gate. Embodiments of the present disclosure use a "diamond last" process using thermally stable metal nitride gate electrodes to enable thicker heat spreading films and facilitate process integration. In an embodiment, the "diamond last" process with high thermal conductivity diamond is enabled by the integration of thermally stable metal-nitride gate electrodes.

20 Claims, 12 Drawing Sheets

(51) Int. Cl.
  *H01L 23/373* (2006.01)
  *H01L 21/02* (2006.01)
  *H01L 29/423* (2006.01)
  *H01L 29/40* (2006.01)
  *H01L 29/08* (2006.01)
  *H01L 29/20* (2006.01)
  *H01L 29/205* (2006.01)
  *H01L 29/66* (2006.01)
  *H01L 21/283* (2006.01)
  *H01L 21/311* (2006.01)

(56) References Cited

U.S. PATENT DOCUMENTS

| | | | |
|---|---|---|---|
| 2012/0193677 A1* | 8/2012 | Parikh | H01L 29/1075 257/190 |
| 2014/0110722 A1* | 4/2014 | Kub | H01L 29/66462 257/77 |
| 2015/0171188 A1* | 6/2015 | Yoon | H01L 29/404 438/571 |

* cited by examiner

US 10,002,958 B2

DIAMOND ON III-NITRIDE DEVICE

CROSS REFERENCE TO RELATED APPLICATIONS

This application claims the benefit of U.S. Provisional Patent Application No. 62/347,287, filed on Jun. 8, 2016, which is incorporated by reference herein in its entirety.

FIELD OF THE DISCLOSURE

This disclosure relates to transistors, including High Electron Mobility Transistor (HEMT) devices.

BACKGROUND

The past several years have seen remarkable improvement in GaN-based High Electron Mobility Transistor (HEMT) technology. Much of this is due to improvements in material growth, device design, and device fabrication. Despite significant improvements in power added efficiencies, it is becoming increasingly clear that GaN HEMTs designed for RF, microwave, millimeter wave power, and power switching applications are severely limited by the ability to dissipate heat and thus must run at significantly reduced power levels, pulse length, and duty cycle.

Recent thermal simulations indicate that the substrate is not the primary source of the thermal impedance; rather it is the ability of the III-nitride semiconductor material layers to locally spread the heat to the surrounding material and substrate due to the extraordinarily high power dissipation density in the near-channel device region (estimated at many megawatts) and the strong reduction in thermal conductivity with increasing temperature. Integrating the capability to locally spread the thermal power dissipated near the channel will have a large impact on overall device performance and allow significant total power output improvements.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Figure 10:
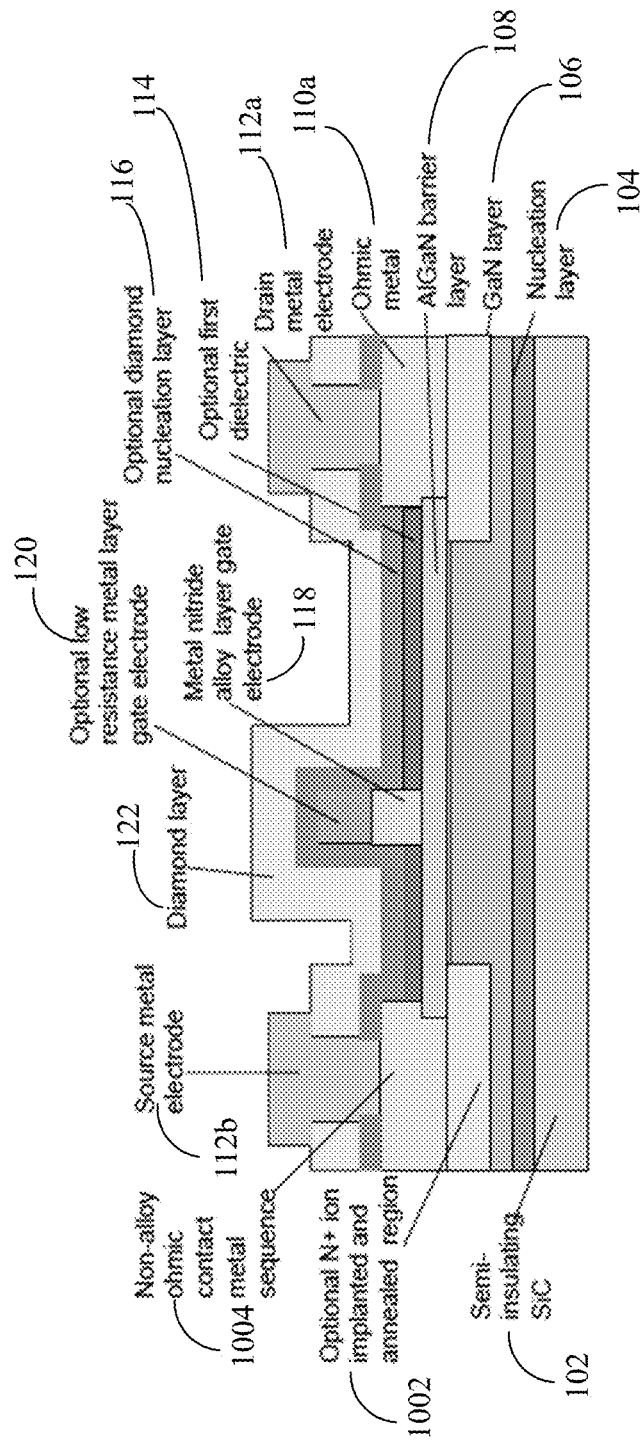
Figure 11:
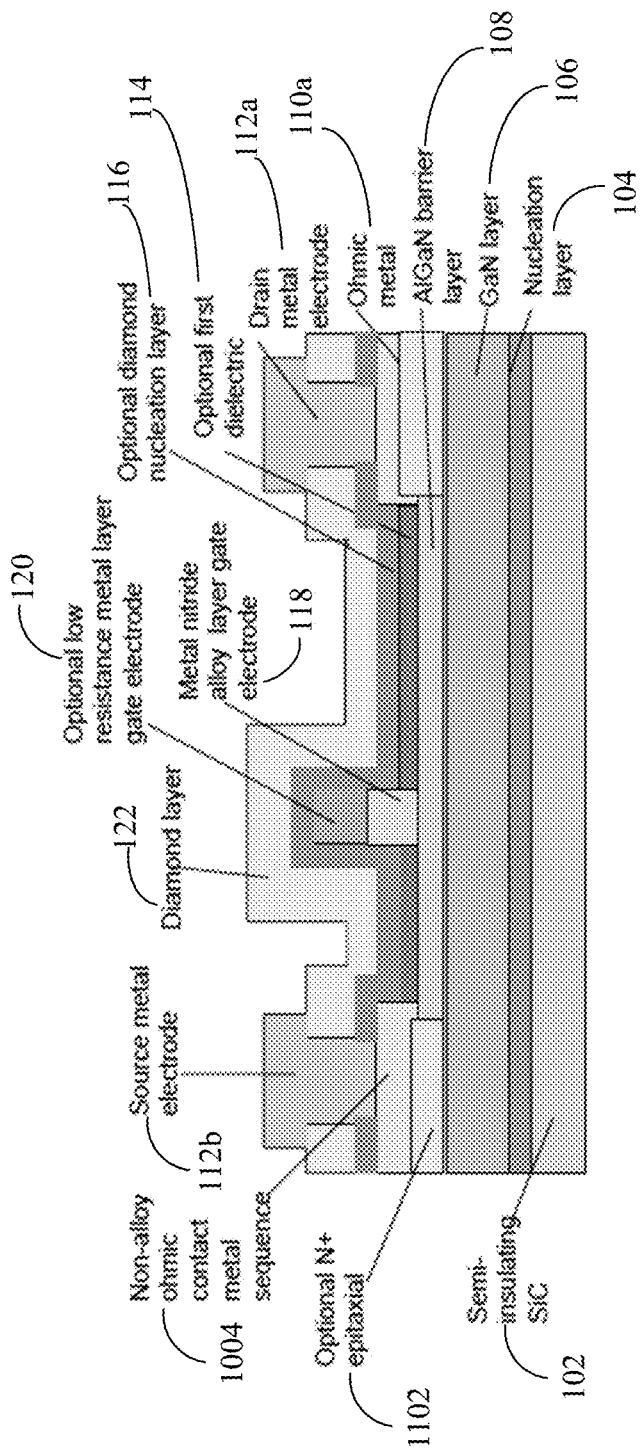

FIG. 10 is a cross section of a diamond after gate AlGaN/GaN HEMT comprising a non-alloy ohmic contact metal sequence with an optional N+ ion implanted region in accordance with an embodiment of the present disclosure; and FIG. 11 is a cross section of a diamond after gate AlGaN/GaN HEMT comprising a non-alloy ohmic contact metal sequence with an optional N+ selective epitaxial grown region in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. OVERVIEW

Embodiments of the present disclosure provide systems and methods for depositing metal on GaN transistors after gate formation using a metal nitride Schottky gate. High thermal conductivity diamond is deposited at over 500 degrees Celsius, which is not compatible with Schottky gate structures for GaN transistors. Transition metal nitrides offer low sheet resistance and suitable work function to behave as Schottky gate electrodes in GaN transistor structures. Transition metal nitrides offer high thermal stability (>800 degrees Celsius) and are compatible with diamond growth conditions. This enables diamond deposition after contact formation, enabling thicker layers than in currently available processes.

Other HEMTs have utilized low temperature diamond, which has poor thermal conductivity and/or have used a "gate after diamond" process, which is limited by the diamond film thickness and aspect ratio of the gate recess (e.g., limiting the frequency capability of the transistor). Embodiments of the present disclosure utilize a "diamond last" process with high thermal conductivity diamond enabled by the integration of thermally stable metal-nitride gate electrodes, which enables thicker heat-spreading diamond films and facilitates process integration.

In an embodiment, diamond heat spreading layers provide cooling of the GaN transistor to enable improved reliability and higher power output. Embodiments of the present disclosure use a "diamond last" process using thermally stable metal nitride gate electrodes to enable thicker heat spreading films and facilitate process integration. In an embodiment, the "diamond last" process with high thermal conductivity diamond is enabled by the integration of thermally stable metal-nitride gate electrodes (e.g., using a transition metal nitride gate electrode). Embodiments of the present disclosure can significantly improve the power capability of the GaN-based microwave power transistor.

Metal material such nickel or nickel with a gold overlayer is typically used for the Schottky gate of a III-nitride HEMT. When subjected to high temperatures, the nickel is known to diffuse into the III-nitride semiconductor material resulting in increased leakage currents for the gate of an III-nitride HEMT device. Diamond films are typically deposited at relatively high temperatures.

Systems and methods for integrating a diamond thin film layer into a GaN Field Effect Transistor (FET) process and more specifically, an AlGaN/GaN HEMT (High Electron Mobility Transistor) process, utilizing a metal nitride alloy gate process and diamond deposition after gate electrode is formed are disclosed in accordance with embodiments of the present disclosure. The diamond thin film layer can act to improve lateral heat spreading locally in and near the active region of power dense microwave and millimeter wave devices. The lateral heat spreading can increase the area for vertical heat transfer to the substrate. In addition, the lateral heat spreading can transfer the heat to thermal shunts built into the substrate. Because of the lateral heat spreading enabled by the diamond thin film, there is reduced peak channel temperature and improved transistor reliability.

Embodiments of the present disclosure provide for improved AlGaN/GaN HEMT pulse length and duty cycle, as well as increased power switching capability and total RF, microwave and millimeterwave output power and gain, and further provide for reliable high temperature operation. In some embodiments, the conductive material used for the transistor gate electrode is subjected to the high process temperature and high hydrogen process environment of the diamond deposition process. In some embodiments, it is desirable that the conductive material selected for the transistor gate electrode have low migration (low diffusion) into the III-nitride semiconductor material or the gate insulator material during the high process temperature of the diamond temperature.

In some embodiments, the device is a diamond after gate III-nitride field effect transistor (FET) comprising a metal nitride alloy gate material layer. In some embodiments, the device is a diamond after gate III-nitride FET comprising a composite metal nitride alloy gate material layer. In some embodiments, the composite metal nitride alloy gate material comprises a high work function metal nitride alloy gate material in direct contact with the III-nitride semiconductor and metal nitride alloy gate material with other properties such as lower resistivity or high barrier metal properties on top of the high work function metal nitride alloy gate material.

In some embodiments, the device is a diamond after gate III-nitride FET comprising a 3D conformal metal nitride alloy gate material layer. In some embodiments, the device is a diamond after gate III-nitride field effect transistor comprising a gate insulator layer. In some embodiments, the diamond after gate III-nitride field effect transistor has reduced thickness of diamond material layer, no diamond material layer, or a reduced amount of diamond material layer in the gate to drain region to reduce the gate-to-drain capacitance. In some embodiments, the gate design may be a "T-gate" or "gate field plate" or a three-dimensional conformal gate electrode.

An exemplary method of fabricating a III-nitride field effect transistor with a diamond film layer after the gate includes the use of a metal nitride alloy Schottky gate electrode that minimize the atom diffusion of the gate electrode material into the III-nitride semiconductor during the high temperature diamond deposition step. In some embodiments, the metal nitride alloy gate electrode is deposited with a non-plasma or non-energetic ion process, such as atomic layer deposition, chemical vapor deposition, or molecular organic chemical vapor deposition. In some embodiments, a nitrogen rich metal nitride alloy film is deposited in direct contact with the III-nitride semiconductor to provide a higher work function and thus reduced gate leakage. In some embodiments, the nitrogen rich III-nitride material comprises an additional metal nitride alloy layer to provide such properties as lower resistance or barrier metal properties to implement a composite III-nitride gate electrode material. In some embodiments, a first dielectric layer is optionally used to protect the surface of the III-nitride material form process environments of the diamond film deposition process. As disclosed herein, several aspects for the diamond after metal nitride alloy gate electrode GaN FET process include an optional first dielectric layer on the III-nitride semiconductor material surface to protect and passivate the III-nitride semiconductor surface.

This technology can be applied to other transistor technologies such as InGaAs/GaAs psuedomorphic HEMT transistor technology, SiC MESFET technology, and InP heterojunction bipolar transistor technology.

2. EXEMPLARY METHOD FOR INTEGRATING A DIAMOND THIN FILM LAYER INTO A FET

Figure 1:
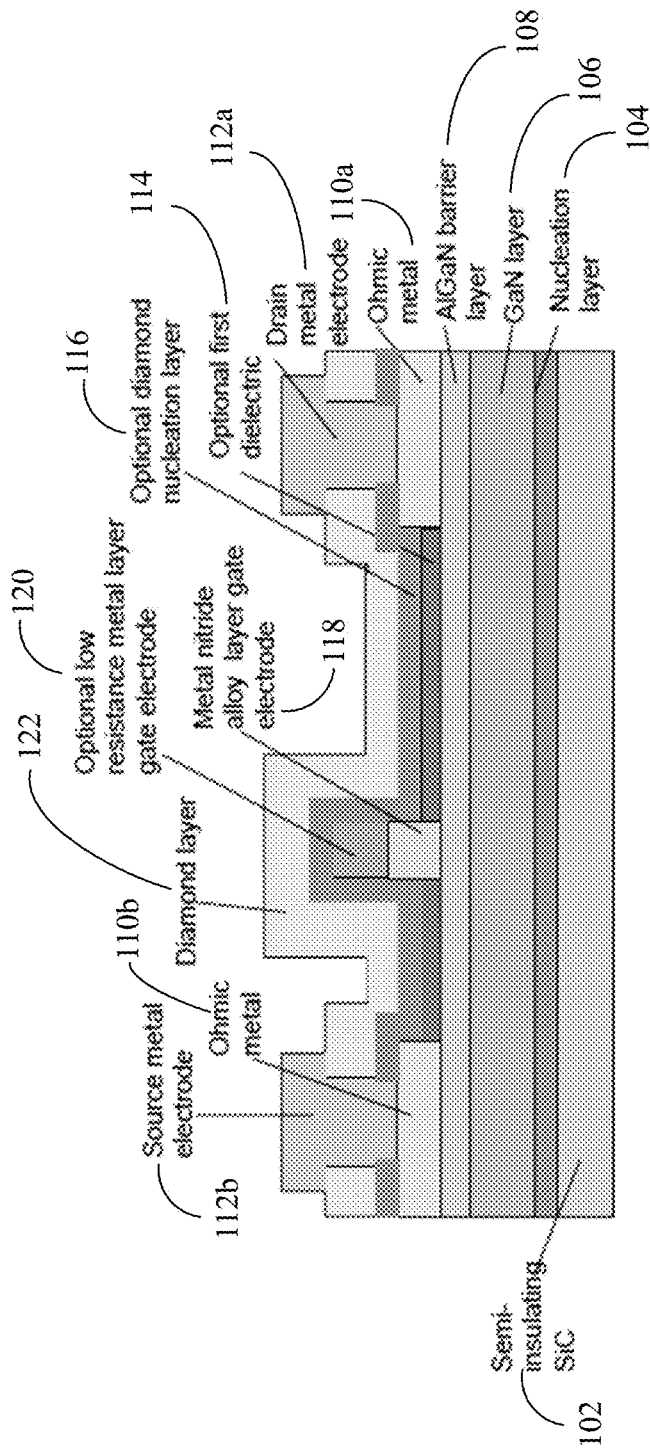
FIG. 1 is a cross section of a diamond after gate AlGaN/GaN HEMT comprising a metal nitride alloy gate material layer in accordance with an embodiment of the present disclosure.

FIG. 1 is a cross section of diamond after gate AlGaN/GaN HEMT comprising a metal nitride alloy gate material layer in accordance with an embodiment of the present disclosure. FIG. 1 includes a semi-insulating Silicon Carbide (SiC) layer 102, a nucleation layer 104, a GaN layer 106, an AlGaN barrier layer 108, ohmic metal layers 110, drain metal electrode 112a and source metal electrode 112b, optional first dielectric layer 114, optional diamond nucleation layer 116, metal nitride alloy layer gate electrode 118 (e.g., formed from a transition metal), optional low resistance metal layer gate electrode 120, and diamond layer 122.

An example of a method for fabricating a diamond after metal nitride alloy gate GaN field effect transistor (FET) in accordance with an embodiment of the present disclosure will now be discussed with reference to FIG. 1. For example, the GaN/AlGaN layers 106 and 108 can be grown (e.g., with an optional thin GaN cap layer), typically by Metal-Organic Chemical Vapour Deposition (MOCVD) or Molecular Beam Epitaxy (MBE). Optionally, an in-situ dielectric layer (e.g., an in-situ silicon nitride layer, a silicon oxide layer, and/or metal oxide layer) can be grown while the substrate is within the MOCVD or MBE growth system. One advantage of an in-situ dielectric layer is that the AlGaN/GaN surface 106/108 is not exposed to an oxidizing ambient so that an AlGaN 108 or GaN 106 surface can be passivated with an in-situ grown dielectric layer without a need to remove a native oxide layer. In an embodiment, the next step in an AlGaN/GaN HEMT process is typically to perform a device isolation process, typically implemented by a mesa etch process (e.g., the device isolation process can be performed by mesa etch at this step in the process; however, there are alternate methods of forming the device isolation, such as ion implantation later in the process, in accordance with embodiments of the disclosure.)

In an embodiment, the source/drain ohmic contacts 110 for metal electrodes 112 are then formed (e.g., using conventional photolithography, metal deposition, and anneal). If the in-situ dielectric layer is sufficiently thin, the ohmic metal alloy will spike through the thin in-situ dielectric layer and it will not be necessary to form a contact window photostep to make an opening in the in-situ dielectric layer for direct ohmic metal to AlGaN or GaN contact. In an embodiment, the next steps include: appropriate cleaning of the AlGaN or GaN surface, an optional plasma nitrogen step to react nitrogen with the AlGaN or GaN surface to minimize nitrogen vacancies at the AlGaN or GaN surface, and an optional anneal step in a nitrogen environment.

In an embodiment, the optional first dielectric layer 114 can be deposited before or after the gate electrode 118 is formed. The optional first dielectric layer 114 can protect and passivate the AlGaN or GaN surface during the diamond nucleation layer 116 deposition and diamond thin film layer growth. The first dielectric layer 114 can comprise an in-situ grown dielectric layer (or layers), a combination of an in-situ grown dielectric layer (or layers), an ex-situ grown dielectric layer (or layers) (e.g., ex-situ means deposited in a system other than the original AlGaN/GaN growth system), or an ex-situ grown dielectric layer (or layers). The first dielectric layer 114 can be a composite dielectric layer comprising one or more dielectric layers on the AlGaN or GaN surface grown using either in-situ or ex-situ growth techniques. In an embodiment, in-situ and ex-situ dielectric layers will typically be from the group of silicon nitride, silicon oxide, aluminum nitride, or metal oxide, with typical metal oxide layers being such thin film layers as aluminum oxide, hafnium oxide, lanthanium oxide, gadilinum oxide, or strontium oxide, or a composite dielectric comprising a combination of silicon nitride, silicon oxide and/or metal oxide.

In an embodiment, the in-situ grown dielectric layers will typically be grown by a chemical vapor deposition (CVD), metal organic chemical vapor deposition (MOCVD), molecular beam Epitaxy (MBE) or plasma deposition technique. In an embodiment, the ex-situ dielectric layer deposition approach includes all of the commonly known thin film growth techniques, but can also include new growth techniques such as atomic layer deposition, plasma enhanced chemical vapor deposition, and chemical vapor deposition. An example of a candidate first dielectric layer 114 would be a 1 nm thick in-situ grown silicon nitride layer followed by the deposition of an ex-situ 3 nm thick $Al_2O_3$ layer formed by an Atomic Layer Deposition process. In the case that an in-situ silicon nitride layer is not used, it can be desirable to expose the AlGaN or GaN surface to a nitrogen plasma to react nitrogen with the AlGaN or GaN surface to reduce the number of nitrogen vacancies at the surface prior to the deposition of the ex-situ dielectric layer.

The first dielectric layer 114 can provide a number of benefits. These benefits can include that it passivates the GaN (or AlGaN) surface to achieve low interface state density or the preferred fixed charge in the dielectric. This thin dielectric film can typically be a silicon nitride deposited layer but can be an aluminum oxide deposited layer, hafnium oxide deposited layer, other metal oxide deposited layer, or a combination of proceeding layers. The best surface passivation of GaN is typically obtained for silicon nitride layer deposited directly on a GaN, AlGaN, or AlN surface.

The first dielectric layer 114 can act as an insulating gate dielectric layer beneath a metal gate. It can protect the GaN 106 or AlGaN 108 surface mechanical from damage during the diamond deposition process. The diamond deposition process typically uses the ultrasonic deposition of nanocrystalline diamond particles that act as a nucleation layer for diamond growth. The diamond particles accelerated by ultrasonic energy can collide with the GaN surface 106, causing mechanical damage. Furthermore, it can protect the AlGaN 108 or GaN 106 surface from chemical decomposition during the growth of the diamond film. The growth environment for diamond typically includes $CH_4/H_2$ gas mixture, and these gases can decompose the GaN surface 106 at typical diamond growth temperatures. A thin layer of silicon nitride or other dielectric material can protect the GaN surface 106 during diamond growth.

In an embodiment, the first dielectric layer 114 should be optimized for the capability to have a low surface state density, low hot electron carrier trapping, high dielectric field strength, low transistor current collapse characteristics, and low transistor dispersion characteristics. In an embodiment, the first dielectric layer 114 should be sufficiently thin so that the thermal impedance from the semiconductor surface to the diamond heat-spreading layer is low. In an embodiment, an optional anneal at approximately 600 degrees Celsius can be performed to increase the dielectric strength of the ex-situ deposited first dielectric layer.

Next, in an embodiment, the first dielectric layer 114 can be etched to the AlGaN 108 or GaN 106 surface. Alternately, in an embodiment, the first dielectric layer 114 can be left unetched, and, in this case, the first dielectric layer 114 can be used as a gate insulator dielectric layer. In an embodiment, a typical clean solution for the III-nitride surface is $NH_4OH$. Other process steps that can be used to prepare the surface for Schottky gate metal deposition include exposing the surface to a nitrogen plasma or an anneal in a nitrogen ambient.

In an embodiment, optionally, a thin second dielectric layer can be deposited (e.g., by atomic layer deposition, by CVD, or by a plasma process) within the etched opening in the first dielectric 114 and on the surface of the AlGaN 108 or GaN 106 (or alternately the surface of the first dielectric layer 114) before the gate metal nitride alloy material layer 118 deposition step. This thin second dielectric layer can perform the function of gate insulator dielectric. In some embodiments, the gate metal nitride alloy 118 can be defined to extend beyond the opening in the first or second dielectric layer. This design can be used to implement a gate field plate. An alternate design is to define the Schottky gate to reside within the opening in the first dielectric thin film layer and not overlap the first dielectric layer.

Another option that can be used for AlGaN/GaN HEMT devices is to etch a recess through a GaN cap layer and/or part of the way through the AlGaN layer. An advantage of the recess etch into the AlGaN layer is to change the threshold voltage of the device. One approach to implementing a normally-off transistor is to etch a recess completely through the AlGaN layer. An exemplary design for an AlGaN/GaN HEMT transistor with a recess is to first etch the recess and then define the Schottky gate to be placed within the recess without the Schottky gate metal contacting the edges of the recess. In an embodiment, implementing this design for the diamond after metal nitride alloy gate technology could involve forming the gate layer 118 ("metal nitride alloy layer gate electrode" in FIG. 1), depositing diamond nucleation layer 116, and depositing the diamond film layer ("diamond layer" in FIG. 1) 122. In an embodiment, the gate metal nitride alloy layer 118 (Schottky gate material layer if metal is in direct contact with the semiconductor) is next deposited and defined. The metal nitride alloy layer 118 can be a nitrogen rich alloy layer. The metal nitride alloy layer 118 may be a binary or ternary metal nitride alloy layer. For example, in an embodiment, metal nitride alloy layer 118 is a transition metal nitride gate electrode. As discussed above, transition metal nitrides offer high thermal stability (>800 degrees Celsius) and are compatible with diamond growth conditions, In an embodiment, the next step is to deposit an optional diamond nucleation layer 116. In an embodiment, the optional diamond nucleation layer 116 may be a nanocrystalline diamond nucleation layer. For example, the optional diamond nucleation layer 116 can be deposited by incorporating nanocrystalline diamond in a solution and use an ultrasonic process to conformally deposit the nanocrystalline diamond nucleation layer on the exposed surface device structure.

In an embodiment, the next step is to deposit diamond film layer 122. In an embodiment, the diamond film may be a nanocrystalline diamond film or a crystalline diamond film. The nanocrystalline film may have a grain size in the range of about 30 nm to about 150 nm. The crystalline diamond film may have a grain size of about 150 nm to 1000 nm. Approaches to deposit the diamond film layer 122 include, but are not limited to, hot filament chemical vapor deposition and plasma chemical vapor deposition. In some embodiments, the diamond film layer 122 may be deposited with substrate temperatures in the range of about 400 C to about 600 C. In some embodiments, the diamond film layer 122 may be deposited with substrate temperatures in the range of about 600 C to about 750 C. In some embodiments, the diamond film layer 122 may be deposited with substrate temperatures of about 750 C. In some embodiments, the diamond film layer 122 may be deposited with substrate temperatures in the range of about 750 C to about 800 C. In some embodiments, the diamond film layer 122 may be deposited with substrate temperatures in the range of about 800 C to about 900 C. In some embodiments, the diamond film layer 122 may be deposited with substrate temperatures in the range of about 900 C to about 1000 C.

In an embodiment, the source and drain ohmic contact metal sequence (comprising one or more metal layers) material layers can be formed before or after the diamond thin film layer 122 deposition. For the case that the ohmic contact metal sequence is formed prior to the diamond deposition, it is desirable that the ohmic contact metal sequence be compatible with the diamond deposition temperature. In some embodiments, a high temperature compatible ohmic contact metal sequence may include, but not be limited to, Pt/Al or WSix. In some embodiments, a high temperature compatible ohmic contact metal sequence may include, but not be limited to, Ti/Al/X Ti/Au source/drain ohmic contact metal sequence, where X is titanium boride ($TiB_2$), zirconium nitride (ZrN), titanium nitride, (TiN), tantalum nitride (TaN), or iridum (Ir). In some embodiments, a high temperature compatible ohmic contact metal sequence may include, but not be limited to, zirconium boride ($ZrB_2$), tungsten boride, chrome boride, and titanium boride. In some embodiments, a high temperature compatible ohmic contact metal sequence may include, but not be limited to, a copper overlay metal sequence.

In some embodiments, the high temperature compatible ohmic contact metal sequence may be a non-alloy ohmic contact metal sequence to the two dimensional electron gas. In some embodiments, the non-alloy ohmic contact metal sequence may be a non-spiking ohmic metal contact sequence. For the non-alloy ohmic contact metal sequence approach, the III-nitride barrier layer can be etched and a non-alloy metal stack can be deposited to contact the III-nitride material and two-dimensional electron gas. For the non-alloy ohmic contact metal sequence approach, it can be desirable to ion implant a silicon N-type dopant and activate the dopant or, alternately, epitaxially regrow N-type III-nitride material layer(s) in the region in which the III-nitride barrier layer is removed, and form a non-alloy ohmic contact metal sequence to the N+ layer. In some embodiments, the high temperature compatible non-alloy ohmic contact metal sequence may comprise metal nitride alloy material including, but not limited to, titanium nitride. The non-alloy metal nitride may be deposited by an approach including, but not limited to, atomic layer deposition, chemical vapor deposition, metal organic chemical vapor deposition, or physical vapor deposition.

In an embodiment, for the case that the ohmic metal contact material layers are formed after the diamond deposition, a contact window opening can be made in the diamond to the III-nitride surface, ohmic contact metal can be deposited and defined, and an anneal performed to spike the ohmic metal into the III-nitride material. In an embodiment, if ohmic metal has been formed prior to the diamond deposition, vias can be etched through the diamond layer 122 to ohmic metal 110, and thick metal can be deposited and defined.

In an embodiment, the opening in the diamond layer 122 using a photostep and etching process over the ohmic contacts can be formed after the diamond deposition. Following Schottky gate metal nitride alloy fabrication, thick contact metal could sandwich the diamond between the S/D ohmics and the thick Au overlayer to improve lateral heat dissipation away from the gate-drain area.

In an embodiment, the deposited diamond layer 122 can improve the lateral thermal conduction of heat that is generated in the area of the gate, source, and drain to help spread the heat to a larger area where the heat can be conducted vertically through the substrate to additional material layers on the backside of the substrate that can further help conduct heat away from the device. In an embodiment, the AlN/GaN and AlGaN layers for a GaN FET will typically be grown on a SiC substrate, a GaN substrate, sapphire substrate, an AlN substrate, or a AlGaN substrate. In an embodiment, the SiC substrate will typically have a thermal conductivity of >300 W/mK, and the GaN substrate can have a thermal conductivity of greater than 150 W/mK. The lateral heat spreading of the diamond layer 122 can increase the area for thermal conduction of the heat and thus reduce the thermal impedance for heat conduction.

In an embodiment, for the case that a 'gate field plate' (e.g., see metal field plate 702 in FIG. 7) is formed, the gate metal can overlap a dielectric layer on both sides of the central gate contact, but can typically overlap to a greater extent on the drain side. In an embodiment, the purpose of the gate field plate is to reduce the peak electric field and increase the breakdown voltage. The thickness of the dielectric can be selected to achieve a minimum in the peak electric field. A candidate dielectric thickness where the gate field plate is effective in reducing the peak electric field but thick enough to achieve lateral conduction of generated heat is approximately 700 nm thick.

In an embodiment, the slope of the sidewalls for a portion (or entire sidewall) of the etched opening in the dielectric in which the gate metal nitride alloy 118 will be deposited when implemented with the Gate Field Plate process can be optimized for increasing the breakdown voltage and improving the transistor high frequency performance. For example, a sloped side wall on the etch opening in the dielectric will aid in reducing the peak electric field beneath the gate field plate. The larger the slope is from perpendicular to the AlGaN surface, the larger the reduction in peak electric field beneath the Gate Field Plate. One example of a process to form a sloped side for a portion of the side wall is to use an isotropic plasma etch for a portion of the dielectric etch followed by an RIE etch to the first dielectric layer surface. In an embodiment, the metal nitride alloy 118 can partially or entirely implement a T-gate Schottky metal.

There is an optional approach of forming thermal shunts in the substrate or to flip chip bonded metal post joints to obtain reduced thermal impedance for conducting the heat away from the active area of the device. In an embodiment, the thermal shunts in the substrate are ideally metal filled and conduct the heat vertically to the backside of the substrate, where the heat is then transported to additional material layers. The thermal shunts in the substrate can be arranged so that they either make electrical contact to the source or do not electrically contact the active device region. The metal filled vias do not necessarily have to perform an electrical function, but they can in some cases be arranged to provide low inductance ground contact to the source of the GaN FET.

In an embodiment, the resistivity of the nanocrystalline diamond layer 122 may be selected to be insulating. Alternately, the resistivity of the diamond thin film layer 122 can be selected to be semi-insulating. An advantage of a semi-insulating diamond thin film is that it will be able to conduct charge that is injected into the layer to prevent the build-up of charge regions that can create locations of high electric field that can cause lower breakdown voltage for the device. In addition, a semi-resistive diamond thin film layer 122 can help to reduce the peak electric field, which can lead to a higher breakdown voltage.

Another embodiment for fabricating a diamond after metal nitride alloy gate AlGaN/GaN HEMT comprises processing the device structure so that the diamond nucleation particles are directly on the AlGaN 108 or GaN 106 surface without a first dielectric layer 114. For example, it can be desirable to expose the AlGaN 108 or GaN 106 surface to a nitrogen plasma to react nitrogen with the AlGaN 108 or GaN 106 surface to try to minimize the number of nitrogen vacancies at the AlGaN 108 or GaN 106 surface prior to the deposition of the diamond particle nucleation layer 116. Some advantages of a process without a first dielectric layer 114 is that the diamond is in direct contact with the AlGaN 108 surface to achieve the maximum thermal conductivity. There are a number of issues to the process that does not use a first dielectric layer. In some embodiments, the diamond particle nucleation layer 116 is deposited using ultrasonic agitation. There is a possibility that the GaN surface 106 can be damaged by the energy of the impacting diamond nanoparticles. The diamond growth gas environment can cause the GaN surface 106 to decompose. In addition, the surface state density and fixed oxide charge may not be as low as is the case for a first dielectric layer directly deposited on the AlGaN/GaN surface 108/106. In some embodiments, a first dielectric layer 114 is deposited on the surface of the III-nitride semiconductor material prior to the deposition of the diamond layer 122.

3. FLOWCHART OF EXEMPLARY METHOD FOR INTEGRATING A DIAMOND THIN FILM LAYER INTO A FET

Figure 2:
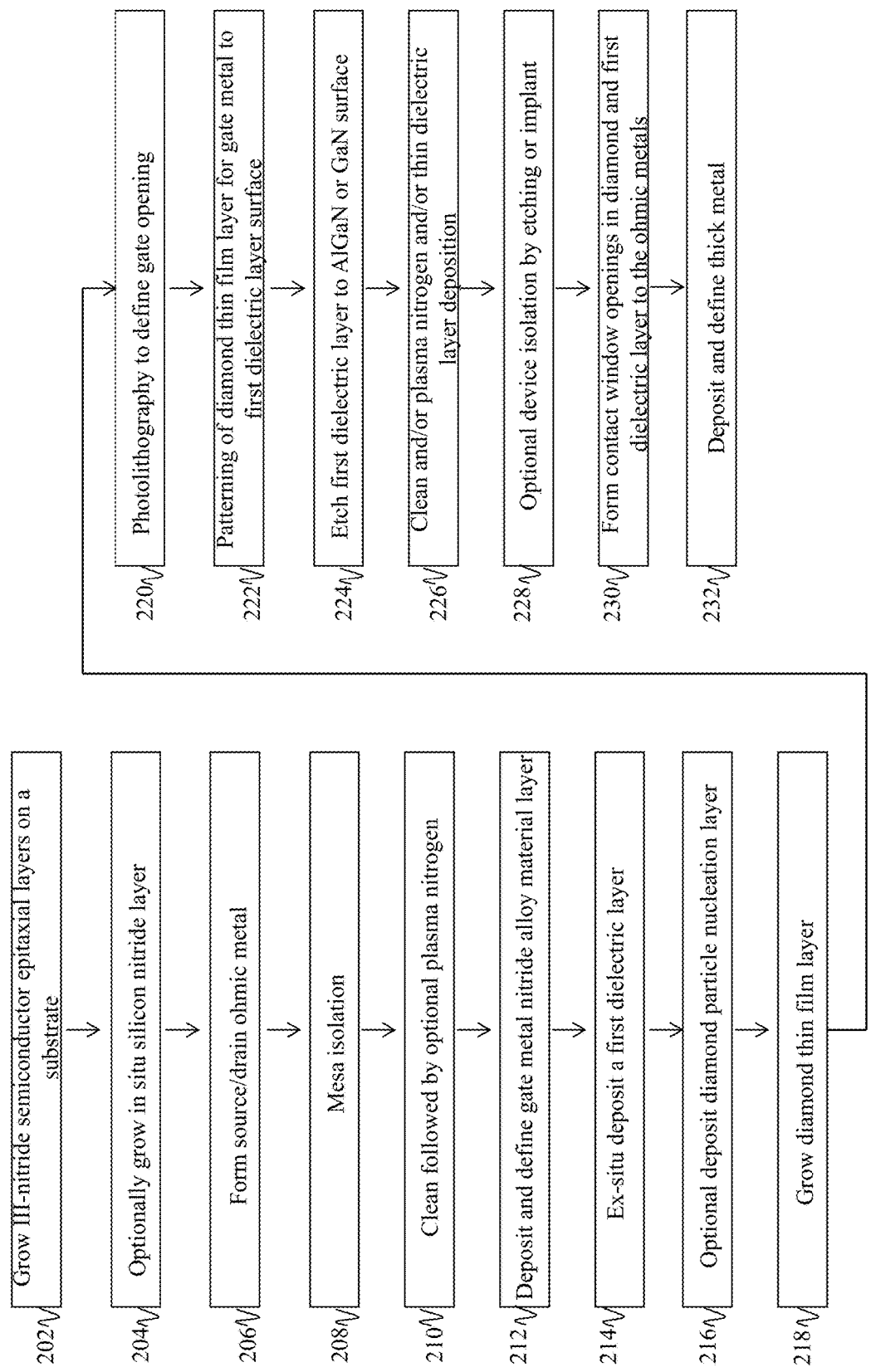
FIG. 2 is a flowchart of an exemplary method for fabricating a diamond after metal nitride alloy gate AlGaN/GaN HEMT in accordance with an embodiment of the present disclosure.

FIG. 2 is a flowchart of an exemplary method for fabricating a diamond after metal nitride alloy gate AlGaN/GaN HEMT in accordance with an embodiment of the present disclosure. In step 202, III-nitride semiconductor epitaxial layers (e.g., layers 102, 104, 106, and 108) are grown on a substrate (e.g., by MOCVD, MBE, or atomic layer epitaxy). In optional step 204, an in situ silicon nitride layer is grown (e.g., in the range of thickness of about 0.2 nm to about 100 nm). In step 206, source/drain ohmic metal 110 is formed. In step 208, mesa isolation is performed (e.g., by etching). In step 210, cleaning is performed, followed by optional plasma nitrogen.

In step 212, the gate metal nitride alloy material layer 118 ("metal nitride alloy layer gate electrode" 118 in FIG. 1) is deposited and defined. In some methods, an approach of depositing the metal nitride alloy material layer 118 are plasma free or energetic ion free approaches such as atomic layer deposition, chemical vapor deposition, or metal organic vapor deposition. In some methods, an approach of depositing the metal nitride alloy material layer 118 is physical vapor deposition methods such as sputtering. The metal nitride alloy material layer 118 can be a nitrogen rich metal nitride alloy. The metal nitride alloy material layer 118 can be a composite metal nitride alloy material layer comprising a nitrogen rich metal nitride layer and a second metal nitride alloy layer. The metal nitride alloy layer 118 may be a binary metal alloy layer or a ternary metal alloy layer. For example, in an embodiment, metal nitride alloy layer 118 is a transition metal nitride gate electrode.

In step 214, a first dielectric layer 114 is ex-situ deposited. In an embodiment, it may include, but not be limited to, aluminum oxide, aluminum nitride, hafnium oxide, gadolinium oxide, scandium oxide, silicon nitride, silicon oxide, another metal oxide layer, or a combination of dielectric material layers. In optional step 216, a diamond particle nucleation layer 116 is deposited (e.g., a nanocrystalline diamond nucleation layer.) In step 218, a diamond thin film layer 122 is grown.

In step 220, photolithography is performed to define a gate opening. An optional process would be to form contact windows to ohmic metal during this photostep process as well. In step 222, patterning of the diamond thin film layer 122 for gate metal to the first dielectric layer 114 surface is performed either by subtractive etch of diamond or selective growth of diamond.

In step 224, the first dielectric layer 114 is etched to the AlGaN 108 or GaN 106 surface. In step 226, cleaning, plasma nitrogen, and/or thin dielectric layer deposition steps are performed. It is also possible to form etch contact windows through the diamond thin film layer to the AlGaN/GaN surface, deposit ohmic metal, and anneal to form the ohmic metal contact. In optional step 228, device isolation (e.g., by etching or implant) is performed (if not performed at an earlier step). In step 230, contact windows openings are formed in diamond 122 and the first dielectric layer 114 to the ohmic metals 110 (if not previously formed during patterning of opening in diamond for gate metal). In step 232, thick metal is deposited and defined.

4. METAL NITRIDE ALLOY COMPOSITION

In an embodiment, the low atom migration metal nitride alloy material layer 118 may be selected from a group of materials comprising titanium nitride, titanium carbon nitride, titanium niobium nitride, titanium aluminum nitride, tantalum nitride, tungsten nitride, niobium nitride, niobium titanium nitride, molybdenum nitride, tantalum nitride ($Ta_3N_5$), zirconium nitride ($Zr_3N_4$), zirconium titanium nitride, hafnium nitride ($Hf_3N_4$), and copper nitride ($Cu_3N$). The low atom migration metal nitride may be a binary metal nitride or a ternary metal nitride alloy material. In some embodiments, the low atom migration metal nitride may be nitrogen rich TiNx with a ratio of nitrogen to titanium atoms greater than 1.0.

5. COMPOSITE METAL NITRIDE ALLOY/METAL NITRIDE ALLOY MATERIAL LAYER

Figure 3A:
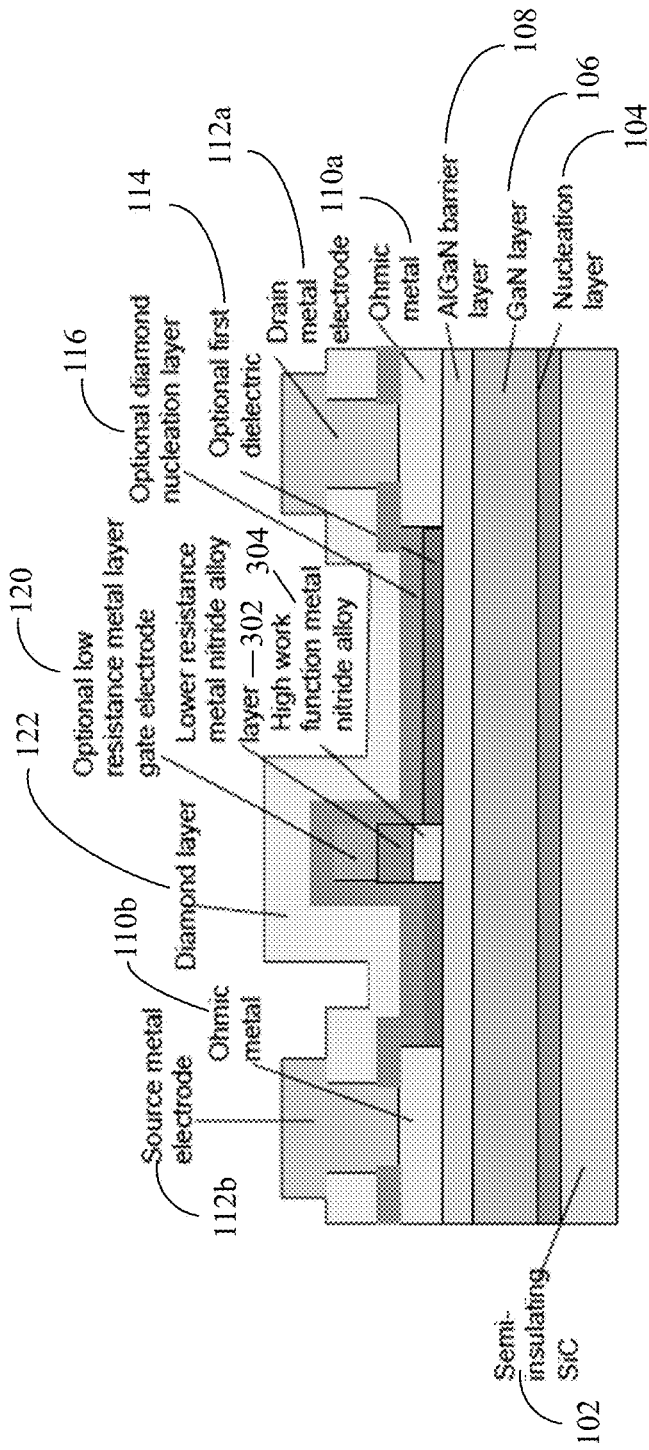
FIG. 3A is a cross section of a diamond after gate AlGaN/GaN HEMT comprising a composite metal nitride alloy gate material layer in accordance with an embodiment of the present disclosure.

FIG. 3A is a cross section of a diamond after gate AlGaN/GaN HEMT comprising a composite metal nitride alloy gate material layer in accordance with an embodiment of the present disclosure. In an embodiment, the composite metal nitride alloy material layer may have a first metal nitride alloy material layer (e.g., high work function metal nitride alloy material layer 304) having a first surface and a second surface. In an embodiment, the second surface is in direct atomic contact with the semiconductor surface. In an embodiment, the composite metal nitride alloy material layer may have a second metal nitride alloy material layer (e.g., lower resistance metal nitride alloy layer 302) with a first and second surface, wherein the second surface is in direct contact with the first surface of the first metal nitride alloy material layer (e.g., high work function metal nitride alloy material layer 304). The second metal nitride alloy material layer may have properties that can include, but are not limited to, being a low resistivity metal nitride alloy material layer or being a barrier metal nitride alloy material layer.

Figure 3B:
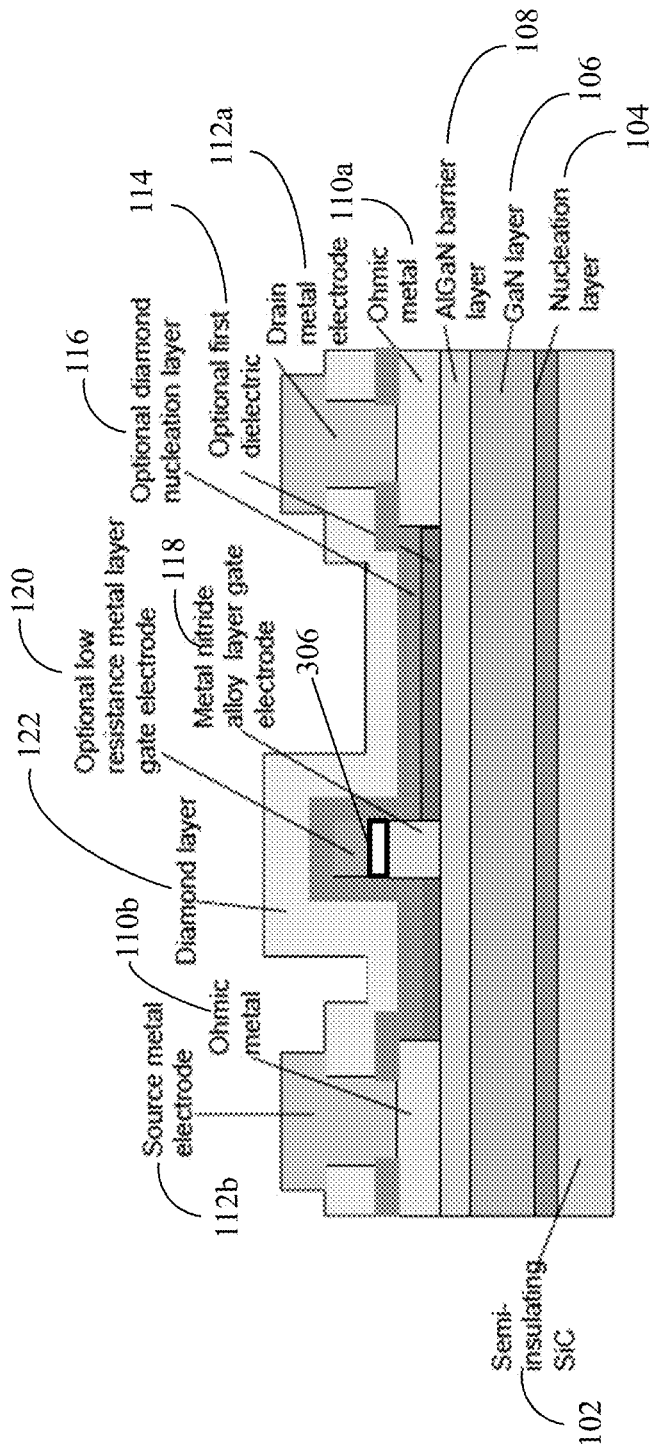
FIG. 3B is a cross section of a diamond after gate AlGaN/GaN HEMT comprising a barrier metal layer in accordance with an embodiment of the present disclosure.

FIG. 3B is a cross section of a diamond after gate AlGaN/GaN HEMT comprising a barrier metal layer in accordance with an embodiment of the present disclosure. In an embodiment, a barrier metal layer 306 can be formed between metal nitride alloy layer gate electrode 118 and low resistance metal layer gate electrode 120. In an embodiment, a barrier metal layer 306 function is to reduce the diffusions of atoms from the overlay metal through the barrier layer metal into and through the first metal nitride alloy material layer. The barrier metal for barrier metal layer 306 may include, but not be limited to, titanium, tantalum, iridium, or tungsten.

6. OVERLAY GATE METAL

In an embodiment, the overlay gate metal is the top most metal of the gate metal stacked sequence (e.g., in an embodiment, optional low resistance metal layer gate electrode 120). In an embodiment, the overlay gate metal should be compatible with the high temperature properties with the diamond deposition temperature. The overlay gate metal may include, but not be limited to, copper, iridium, platinum, nickel, or gold.

7. HIGH WORK FUNCTION METAL NITRIDE ALLOY MATERIAL LAYER

In an embodiment, the low atom migration metal nitride alloy material layer 118 may have a selected work function within the range of about 3.2 eV to about 5.4 eV. In an embodiment, a metal nitride alloy material layer material with a high work function is desirable to reduce the reverse bias leakage current of a metal nitride Schottky diode.

Approaches to increase the work function of the metal nitride alloy material layer material may include, but not be limited to, increasing the nitrogen content in the metal nitride alloy material layer, increasing the carbon content in the metal nitride alloy material layer, increasing the oxygen content in the metal nitride alloy material layer, or combinations therein. For example, increasing both the nitrogen and the carbon content in the metal nitride alloy material or increasing the nitrogen and oxygen in the metal nitride alloy material can increase the work function of the metal nitride alloy material layer.

In an embodiment, the high work function metal nitride alloy material layer 304 will typically have a work function value in the range of about 4.5 eV to about 5.4 eV. The high work function metal nitride alloy material layer 304 may be a binary metal nitride alloy material layer having a nitrogen rich material with a ratio of nitrogen to metal atoms greater than 1.0. In some embodiments, the nitrogen to metal atom ratio is greater than 1.1. In some embodiments, the nitrogen to metal atom ratio is greater than 1.2. The high work function metal nitride alloy material layer 304 may also have carbon dopants or oxygen dopants.

The high work function metal nitride alloy material layer 304 may also be a ternary metal nitride alloy material layer, such as a titanium carbon nitride alloy material layer, tantalum carbon nitride, or titanium oxide nitride. The carbon or oxygen dopants of sufficient high concentration to form a ternary alloy material layer can be incorporated during metal nitride alloy material layer material deposition or can be incorporated by annealing in a carbon based molecule ambient, such as methane or an oxygen containing ambient. The oxygen annealing can remove oxygen vacancies and thus increase the work function.

The high work function metal nitride alloy material layer 304 may also be a laminated material structure, such a stacked material layer structure of titanium oxide and titanium nitride, that can be formed by alternating deposition titanium oxide and titanium nitride in an atomic layer deposition system. The work function of the high work function metal nitride alloy material layer 304 can also vary as a function of thickness of the material layer. In an embodiment, the work function of the metal nitride alloy material layer increases with increasing thickness of the metal nitride alloy material layer.

The high work function metal nitride alloy material layer 304 may be a low atom migration high work function metal nitride alloy material layer. The high work function metal nitride alloy material layer 304 may be a low plasma damage or non-energetic high work function metal nitride alloy material layer. Titanium nitride typically has a work function in the range of about 4.2 eV to about 5.2 eV.

The low migration metal nitride alloy material layer 118 may comprise dopant atoms that may include, but not be limited to, nitrogen, carbon, tantalum, titanium, tungsten or combinations thereof. The metal nitride alloy material layer 118 material may also comprise dopant atoms that may include, but not be limited to, oxygen, platinum, silicon, aluminum, vanadium or combinations therein.

8. STABLE MATERIAL UNDER ELECTRIC FIELD, THERMAL, OR RADIATION STRESS

In an embodiment, the low atom migration metal nitride alloy material layer 118 may be an enhanced device that includes, but is not limited to, an enhanced high electric field reliable device, an enhanced high temperature reliable device, an enhanced high radiation reliable device or combinations thereof. In an embodiment, the low atom migration metal nitride alloy material layer 118 is stable under stresses which may include, but not be limited to, electric field stress, thermal stress, radiation stress, or combination therein. The low atom migration metal nitride alloy material layer 118 may be an enhanced high electric field reliable device, an enhanced high temperature reliable device, and/or an enhanced high radiation reliable device.

9. NON-PLASMA DAMAGE OR NON-ENERGETIC ION DAMAGE

In an embodiment, the semiconductor material can be damaged by energetic ions, energetic electrons, or ultraviolet light that can be present in the environment in the apparatus that is used to deposit the metal nitride alloy material layer. For example, a sputtering deposition approach has energetic ions in the deposition tool environment that impact into the semiconductor material and creates point defects within about 30 nm of the semiconductor surface and surface state traps at the semiconductor surface. Plasma deposition approaches, such as Plasma Enhanced Chemical Vapor deposition, also have energetic ions and ultraviolet wavelengths within the deposition tool environment that can impact into the semiconductor material and create point defects within about 30 nm of the semiconductor surface and surface state traps at the semiconductor surface. The additional plasma damage or energetic ion damage point defects within the semiconductor and additional surface state traps can create enhanced leakage current and reduced carrier mobility in a device such as a two-terminal Schottky diode or a three-terminal field effect transistor that is formed in the region near of the semiconductor surface.

In an embodiment, a deposition metal may be selected to have low plasma damage or low energetic ion damage at the surface of the semiconductor. The low atom migration metal nitride alloy material layer 118 may have a low density of displaced atoms (point defects) within the semiconductor within 100 nm of the metal nitride alloy material layer 118 (within 100 nm of the semiconductor surface). Deposition methods for the metal nitride alloy material layer 118 that have low plasma damage or low energetic ion damage in the semiconductor can include, but not be limited to, atomic layer deposition, chemical vapor deposition, or metal organic chemical vapor deposition. In addition, additional deposition techniques that have low plasma damage or low energetic ion damage within the semiconductor include remote plasma assisted atomic layer deposition, ozone assisted atomic layer deposition, or plasma assisted atomic layer deposition. The low atom migration metal nitride alloy material layer 118 may be a non-plasma damaged device or a non-energetic ion damaged device or a non-ultraviolet light damage device.

10. LARGE AREA UNIFORM DEPOSITION

In an embodiment, the low atom migration metal nitride alloy material layer 118 may have lateral material composition uniformity and material thickness uniformity over the lateral dimension of a substrate surface. For selected deposition methods, the lateral thickness uniformity may be less than 2% thickness non-uniformity over the substrate surface (excluding 2 millimeters from the edge of the substrate). Deposition methods for the metal nitride alloy material layer 118 that have lateral uniform material composition and material thickness uniformity lateral material composition uniformity and material thickness uniformity over the lateral dimension of a substrate surface include, but are not limited to, atomic layer deposition, chemical vapor deposition, metal organic chemical vapor deposition, remote plasma assisted atomic layer deposition, ozone assisted atomic layer deposition, or plasma assisted atomic layer deposition.

11. LARGE AREA ELECTRICALLY UNIFORM CHARACTERISTICS

In an embodiment, the low atom migration metal nitride alloy material layer 118 may comprise an electrically uniform interface. The low atom migration metal nitride alloy material layer 118 may comprise an electrically uniform interface with reduced density of electrical generated high luminesce hot spots. For selected deposition methods, the forward voltage of a Schottky Diode may have a value that is less than +/−5% forward voltage non-uniformity over the substrate surface (excluding 2 millimeters from the edge of the substrate).

Deposition methods for the metal nitride alloy material layer 118 that have lateral uniform material composition and material thickness uniformity over the lateral dimension of a substrate surface include, but are not limited to, atomic layer deposition, chemical vapor deposition, metal organic chemical vapor deposition, remote plasma assisted atomic layer deposition, ozone assisted atomic layer deposition, or plasma assisted atomic layer deposition.

12. AMORPHOUS OR CRYSTALLINE MATERIAL LAYER

The low atom migration metal nitride alloy material layer 118 may be an amorphous material or may be a crystalline material. The low atom migration metal nitride layer 118 may be a small grain size material layer. The low atom migration metal nitride alloy material layer 118 may be annealed at a selected temperature and selected ambient. The annealing process can cause the metal nitride ions to form grains.

13. NON-ALLOY MATERIAL LAYER SEMICONDUCTOR MATERIAL INTERFACE

The low atom migration metal nitride alloy material layer 118 may comprise a non-alloy material layer of the metal nitride alloy material layer with the semiconductor at the metal nitride/semiconductor interface.

14. VERTICAL GRADED MATERIAL COMPOSITION AND LAMINATED MATERIAL COMPOSITION

The low atom migration metal nitride alloy material layer 118 may have a vertically graded composition. The metal nitride alloy material layer 118 may be formed by a laminate growth process in an atomic layer deposition tool. For example, a metal nitride alloy material layer 118 that would have higher work function is the sequential deposition of a titanium nitride atomic layer and a titanium carbide layer. The percentage of carbon in the film can be varied by selecting the ratio of the number of titanium carbide layers to the number of titanium nitride layers. There can be mixing of the atomic layers after an anneal process. Thus, an alloy such as titanium carbide nitride can be formed by a laminated growth structure. Deposition methods for the metal nitride alloy material layer 118 that may have a graded vertical material composition or laminated material composition include, but are not limited to, atomic layer deposition, remote plasma assisted atomic layer deposition, ozone assisted atomic layer deposition, or plasma assisted atomic layer deposition.

15. CONFORMAL MATERIAL DEPOSITION

Figure 4:
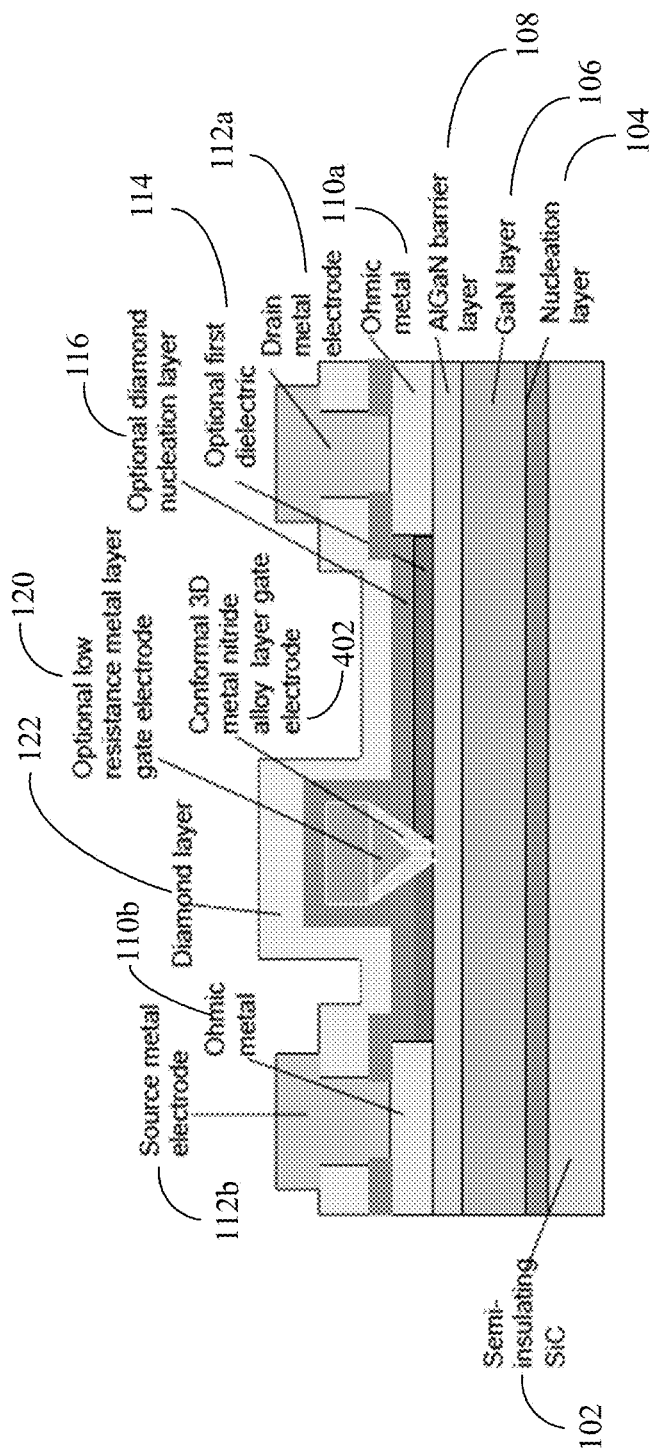
FIG. 4 is a cross section of a diamond after gate AlGaN/GaN HEMT comprising a 3D conformal metal nitride alloy gate material layer in accordance with an embodiment of the present disclosure.

FIG. 4 is a cross section of a diamond after gate AlGaN/GaN HEMT comprising a 3D conformal metal nitride alloy gate material layer 402 in accordance with an embodiment of the present disclosure. In an embodiment, the low atom migration metal nitride alloy material layer 402 may have a conformal material layer thickness on a three-dimensional substrate surface, as illustrated by conformal 3D metal nitride layer gate electrode 402 in FIG. 4.

16. GATE INSULATOR LAYER

Figure 5:
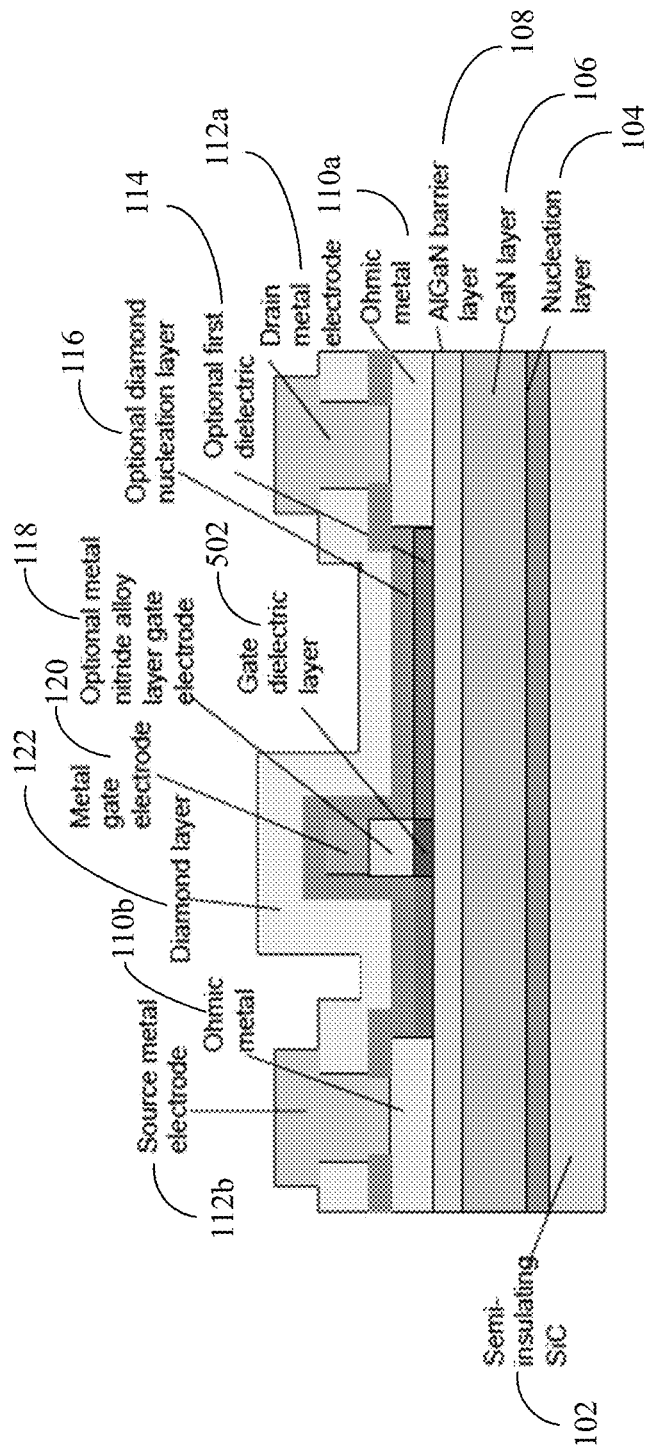
FIG. 5 is a cross section of a diamond after gate AlGaN/GaN HEMT comprising a gate insulator layer in accordance with an embodiment of the present disclosure.

FIG. 5 is a cross section of diamond after gate AlGaN/GaN HEMT comprising a gate insulator layer 502 in accordance with an embodiment of the present disclosure. For example, in an embodiment, optionally, a thin second dielectric layer can be deposited (e.g., by atomic layer deposition or by CVD or plasma process) within the etched opening in the first dielectric 114 and on the surface of the AlGaN 108 or GaN 106 (or alternately the surface of the first dielectric layer 114) before the gate metal nitride alloy material layer 118 deposition step. This thin second dielectric layer 502 can perform the function of gate insulator dielectric.

17. T-GATE

Figure 6:
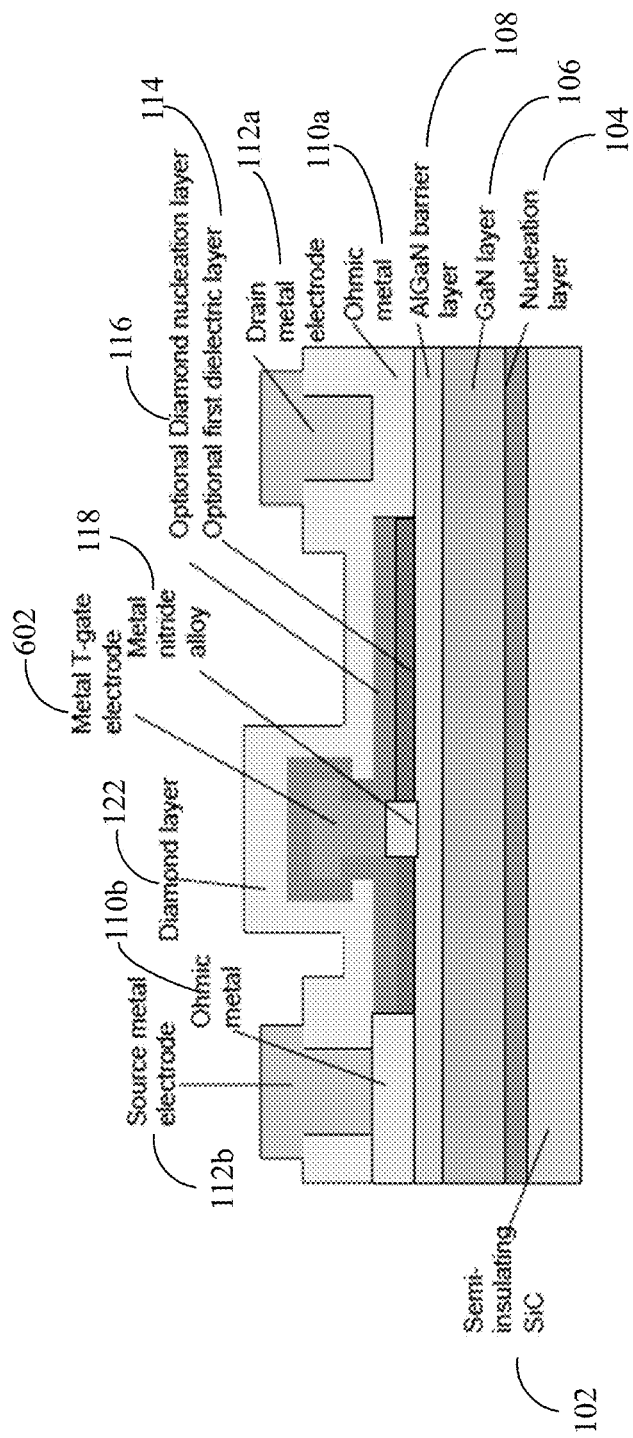
FIG. 6 is a cross section of a diamond after "T-gate" AlGaN/GaN HEMT comprising a metal nitride alloy gate material layer in accordance with an embodiment of the present disclosure.

FIG. 6 is a cross section of diamond after "T-gate" AlGaN/GaN HEMT comprising a metal nitride alloy gate material layer 118 and metal T-gate electrode 602 in accordance with an embodiment of the present disclosure. In an embodiment, metal T-gate electrode 602 comprises a T-gate Schottky metal.

18. GATE FIELD PLATE

Figure 7:
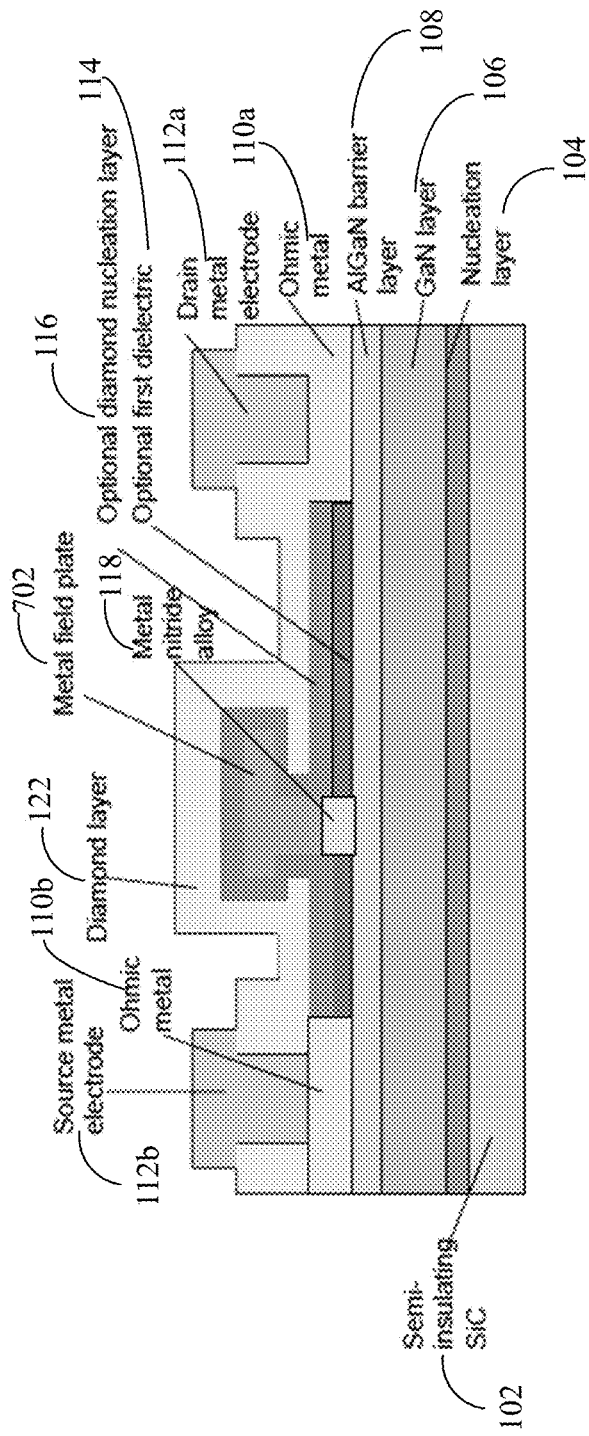
FIG. 7 is a cross section of a diamond after gate AlGaN/GaN HEMT having a field plate and comprising a metal nitride alloy gate material layer in accordance with an embodiment of the present disclosure.

FIG. 7 is a cross section of diamond after gate AlGaN/GaN HEMT having a metal field plate 702 ("gate field plate" in FIG. 7) and comprising a metal nitride alloy gate material layer 118 in accordance with an embodiment of the present disclosure.

For example, in some embodiments, the gate metal nitride alloy 118 can be defined to extend beyond the opening in the first (or second) dielectric layer 114. This design can be used to implement a gate field plate 702. An alternate design is to define the Schottky gate to reside within the opening in the first dielectric thin film layer and not overlap the first dielectric layer.

In an embodiment, for the case that gate field plate 702 is formed, the gate metal can overlap a dielectric layer on both sides of the central gate contact, but can typically overlap to a greater extent on the drain side. In an embodiment, a purpose of the gate field plate 702 is to reduce the peak electric field and increase the breakdown voltage. The thickness of the dielectric can be selected to achieve a minimum in the peak electric field. A candidate dielectric thickness where the gate field plate 702 is effective in reducing the peak electric field but thick enough to achieve lateral conduction of generated heat is approximately 700 nm thick.

19. REDUCED THICKNESS OF DIAMOND IN THE GATE TO DRAIN REGION

Figure 8:
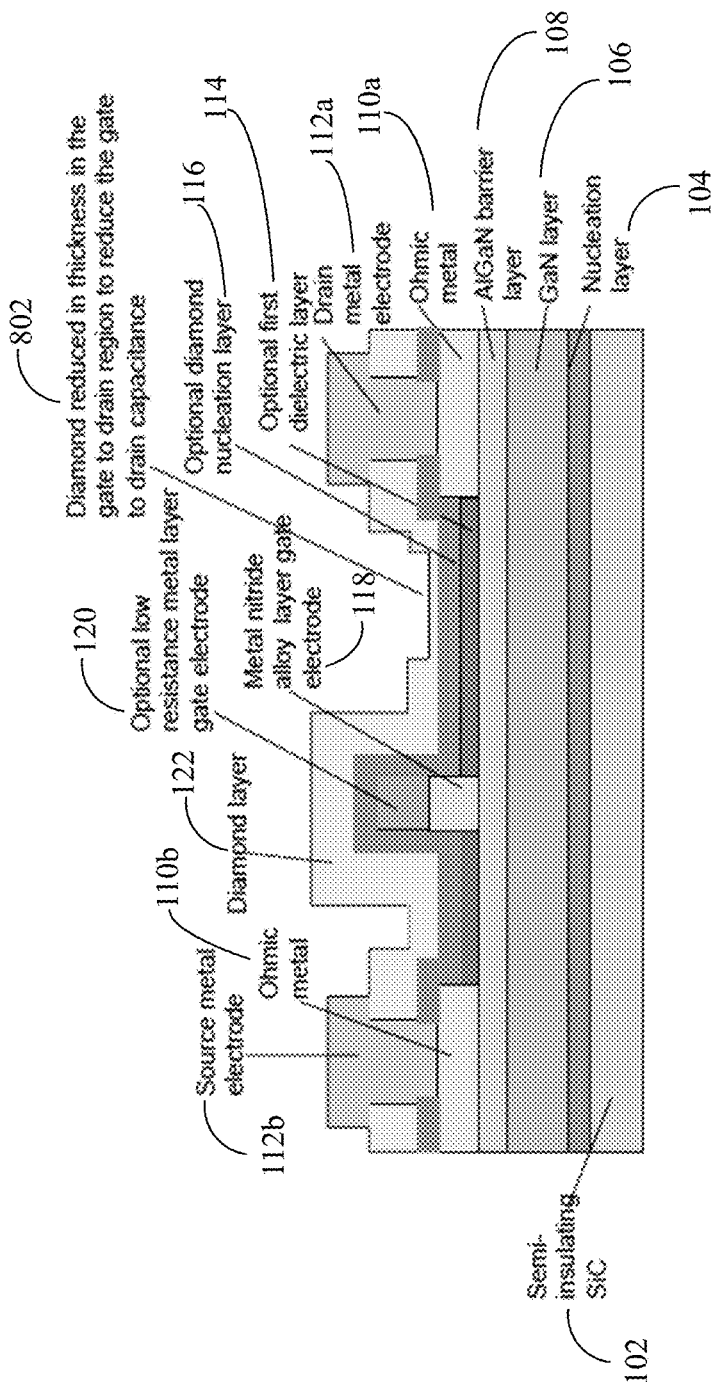
FIG. 8 is a cross section of a diamond after gate AlGaN/GaN HEMT comprising reduced thickness of diamond in the gate to drain region to reduce the gate-to-drain capacitance in accordance with an embodiment of the present disclosure.

FIG. 8 is a cross section of diamond after gate AlGaN/GaN HEMT comprising reduced thickness of diamond in the gate to drain region 802 to reduce the gate-to-drain capacitance in accordance with an embodiment of the present disclosure. For example, in some embodiments, the diamond after gate III-nitride field effect transistor has reduced thickness of diamond material layer or no diamond material layer or reduce amount of diamond material layer in the gate to drain region to reduce the gate-to-drain capacitance.

20. DIAMOND REMOVED IN A PORTION OF THE GATE TO DRAIN REGION

Figure 9:
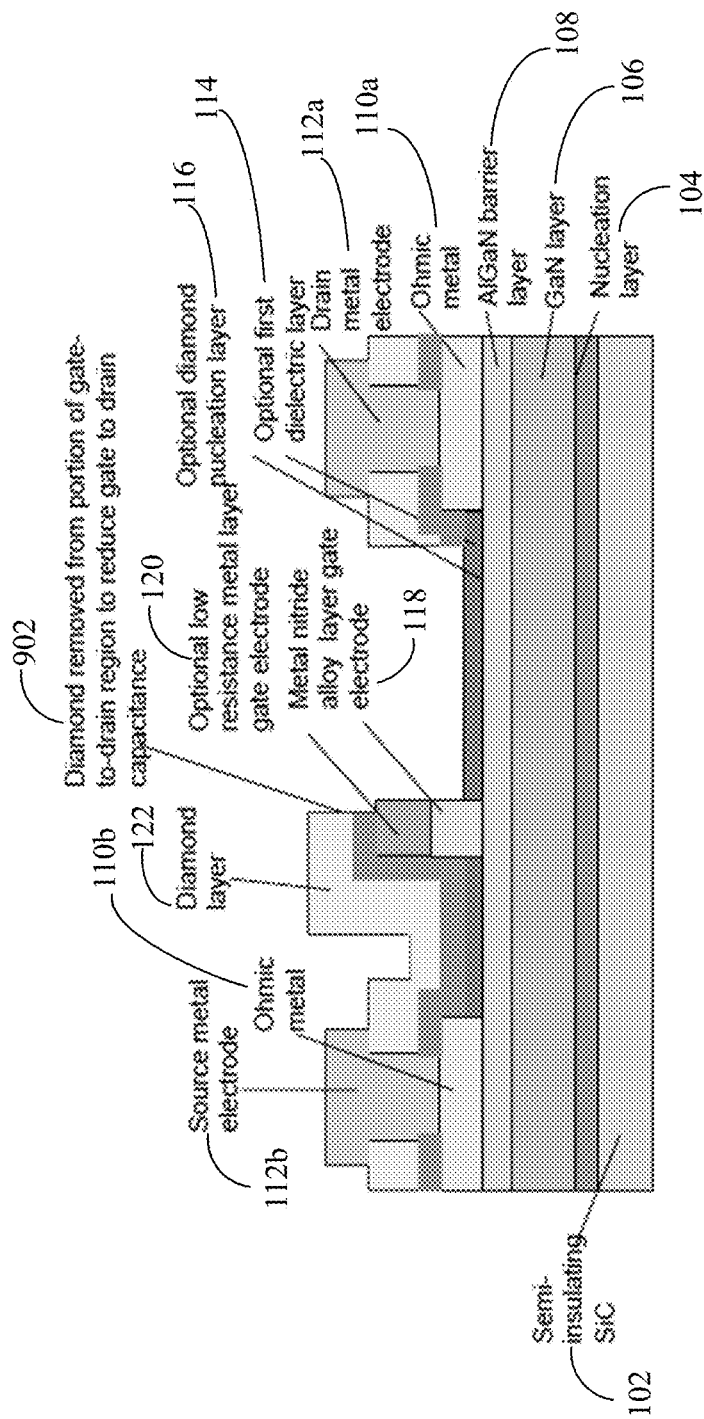
FIG. 9 is a cross section of a diamond after gate AlGaN/GaN HEMT comprising removal of diamond material layer in the gate to drain region to reduce the gate-to-drain capacitance in accordance with an embodiment of the present disclosure.

FIG. 9 is a cross section of diamond after gate AlGaN/GaN HEMT comprising removal of diamond material layer in the gate to drain region 902 to reduce the gate-to-drain capacitance in accordance with an embodiment of the present disclosure.

21. OPTIONAL N+ ION IMPLANTED REGION

FIG. 10 is a cross section of a diamond after gate AlGaN/GaN HEMT comprising a non-alloy ohmic contact metal sequence with an optional N+ ion implanted region 1002 in accordance with an embodiment of the present disclosure. FIG. 10 further includes non-alloy ohmic contact metal sequence 1004.

For example, in a non-alloy ohmic contact metal sequence approach, it can be desirable to ion implant a silicon N-type dopant and activate the dopant or, alternatively, epitaxially regrow a N-type III-nitride material layers in the region in which the III-nitride barrier layer is removed and form a non-alloy ohmic contact metal sequence 1004 to the N+ layer 1002.

22. NON-ALLOY OHMIC CONTACT METAL SEQUENCE WITH AN OPTIONAL N+ SELECTIVE EPITAXIALLY GROWN REGION

FIG. 11 is a cross section of a diamond after gate AlGaN/GaN HEMT comprising a non-alloy ohmic contact metal sequence 1004 with an optional N+ selective epitaxially grown region 1102 in accordance with an embodiment of the present disclosure.

23. CONCLUSION

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A transistor, comprising:
a plurality of semiconductor layers;
a transition metal nitride gate electrode formed on top of the plurality of semiconductor layers; and
a diamond layer formed directly on top of the transition metal nitride gate electrode such that an entire surface of the transition metal nitride gate electrode is covered by the diamond layer and the plurality of semiconductor layers.

2. The transistor of claim 1, wherein the transition metal nitride gate electrode is thermally stable over 800 degrees Celsius.

3. The transistor of claim 1, further comprising:
a low resistance metal layer gate electrode formed between the transition metal nitride gate electrode and the diamond nucleation layer.

4. The transistor of claim 1, further comprising:
a metal T-gate electrode formed between the transition metal nitride gate electrode and the diamond nucleation layer.

5. The transistor of claim 1, further comprising:
a metal field plate formed between the transition metal nitride gate electrode and the diamond nucleation layer.

6. The transistor of claim 1, wherein the transition metal nitride gate electrode comprises:
a high work function metal nitride alloy layer; and
a lower resistance metal nitride alloy layer.

7. The transistor of claim 1, wherein the transition metal nitride gate electrode comprises:
a three-dimensional conformal gate electrode.

8. The transistor of claim 1, further comprising:
a gate insulator layer between the transition metal nitride gate electrode and the a plurality of semiconductor layers.

9. The transistor of claim 1, wherein the diamond layer has reduced thickness in a gate to drain region of the transistor.

10. The transistor of claim 1, wherein a portion of the diamond layer is removed in a gate to drain region of the transistor.

11. The transistor of claim 1, further comprising:
an N+ ion region formed on top of the plurality of semiconductor layers; and
a non-alloy ohmic contact metal sequence formed on top of the N+ ion region.

12. The transistor of claim 1, further comprising:
an N+ epitaxial region formed on top of the plurality of semiconductor layers; and
a non-alloy ohmic contact metal sequence formed on top of the N+ epitaxial region.

13. A Gallium Nitride (GaN) based High Electron Mobility Transistor (HEMT) transistor, comprising:
a plurality of semiconductor layers, comprising:
a Silicon Carbide (SiC) layer,
a nucleation layer,
a Gallium Nitride (GaN) layer, and
an Aluminum Gallium Nitride (AlGaN) layer;
a plurality of ohmic metal layers formed on top of the AlGaN layer;
a plurality of metal electrodes formed on top of the plurality of ohmic metal layers;
a plurality of electrodes, comprising:
a transition metal nitride gate electrode formed on top of the AlGaN layer, and
a low resistance metal gate electrode formed directly on top of the transition metal nitride gate electrode;
a first dielectric layer formed directly on top of the AlGaN layer;
a diamond nucleation layer formed directly on top of the first dielectric layer and the low resistance metal gate electrode such that an entire surface of the plurality of electrodes is covered by the diamond nucleation layer and the AlGaN layer; and
a diamond layer formed directly on top of the diamond nucleation layer.

14. The GaN based HEMT of claim 13, wherein the transition metal nitride gate electrode is thermally stable over 800 degrees Celsius.

15. A method, comprising:
   growing III-nitride semiconductor epitaxial layers on a substrate;
   forming source and drain ohmic metal on the III-nitride semiconductor epitaxial layers;
   depositing a gate transition metal nitride material layer on the III-nitride semiconductor epitaxial layers; and
   growing a diamond layer directly on top of the gate transition metal nitride material layer such that an entire surface of the gate transition metal nitride material layer is covered by the diamond layer.

16. The transistor of claim 1, wherein the transition metal nitride gate electrode is a titanium nitride gate electrode.

17. The transistor of claim 1, wherein the transition metal nitride gate electrode is a tantalum nitride gate electrode.

18. The transistor of claim 1, wherein the transition metal nitride gate electrode is a niobium nitride gate electrode.

19. The transistor of claim 1, wherein the transition metal nitride gate electrode is a molybdenum nitride gate electrode.

20. The transistor of claim 1, wherein the transition metal nitride gate electrode is a zirconium nitride gate electrode.

* * * * *